United States Patent [19]
Arkin

[11] Patent Number: 5,963,074
[45] Date of Patent: Oct. 5, 1999

[54] PROGRAMMABLE DELAY CIRCUIT HAVING CALIBRATABLE DELAYS

[75] Inventor: Brian J. Arkin, Pleasanton, Calif.

[73] Assignee: Credence Systems Corporation, Fremont, Calif.

[21] Appl. No.: 08/877,923

[22] Filed: Jun. 18, 1997

[51] Int. Cl.[6] ...................................................... H03K 5/13
[52] U.S. Cl. ........................... 327/276; 327/284; 327/277
[58] Field of Search .................................... 327/269–272, 327/276–278, 289, 285, 262, 281, 288; 375/371; 365/194

[56] References Cited

U.S. PATENT DOCUMENTS

| | | | |
|---|---|---|---|
| 4,164,648 | 8/1979 | Chu ............................................ | 377/20 |
| 4,714,924 | 12/1987 | Ketzler ...................................... | 327/270 |
| 4,837,521 | 6/1989 | Herlein et al. ............................ | 327/286 |
| 5,107,153 | 4/1992 | Osaki et al. .............................. | 327/288 |
| 5,109,394 | 4/1992 | Hjerpe et al. ............................ | 375/119 |
| 5,214,680 | 5/1993 | Gutierrez, Jr. et al. ................. | 327/261 |
| 5,237,224 | 8/1993 | DeLisle et al. .......................... | 327/276 |
| 5,243,227 | 9/1993 | Gutierrez, Jr. et al. ................. | 327/277 |
| 5,349,612 | 9/1994 | Guo et al. ................................ | 327/270 |
| 5,355,037 | 10/1994 | Andresen et al. ....................... | 327/277 |
| 5,497,263 | 3/1996 | Masuda et al. .......................... | 327/278 |
| 5,552,726 | 9/1996 | Wichman et al. ....................... | 327/277 |
| 5,589,788 | 12/1996 | Goto ......................................... | 327/276 |

OTHER PUBLICATIONS

Masaharu Goto, James O. Barnes and Ronnie E. Owens, "CMOS Programmable Delay Vernier," *Hewlett–Packard Journal*, Oct. 1994, pp. 51–58.

*Primary Examiner*—Timothy P. Callahan
*Assistant Examiner*—Eunja Shin
*Attorney, Agent, or Firm*—Smith-Hill and Bedell

[57] ABSTRACT

A programmable delay circuit produces an OUTPUT signal following an INPUT signal with a delay selected by input delay selection data. The delay circuit includes a tapped delay line, a multiplexer, a delay adjustment stage and a programmable encoder. The delay line includes a set of N delay elements connected in series for successively delaying the INPUT signal to produce a set of N output TAP signals. The multiplexer passes a selected TAP signal to the delay adjustment stage. The delay adjustment stage delays the selected TAP signal to produce the OUTPUT signal. The programmable encoder encodes the input delay selection data to provide signals for controlling the multiplexer and for adjusting the delay of the delay adjustment stage. The manner in which the encoder encodes each separate delay selection data value is adjustable so that each of the N selectable delays can be separately calibrated.

12 Claims, 1 Drawing Sheet

PROGRAMMABLE DELAY CIRCUIT HAVING CALIBRATABLE DELAYS

BACKGROUND OF THE INVENTION

1. Field of the Invention

The present invention relates in general to programmable delay circuits and in particular to a programmable delay circuit for selectively providing any one of a set of delays, wherein each delay is independently calibratable.

2. Description of Related Art

A typical prior art programmable delay circuit includes a tapped delay line and a multiplexer. The delay line is formed by a set of delay stages connected in series for successively delaying an INPUT signal. Each delay stage may, for example, be a simple logic gate which passes an input signal to its output with a delay that depends on the response characteristics of the logic gate. With the output of each delay stage constituting a separate "tap" of the delay line, the INPUT signal appears at each tap in succession as the signal pulse traverses the delay line. The delay line taps are connected to separate inputs of the multiplexer which produces the delay circuit output. The programmable delay circuit is programmed to provide a desired delay simply by supplying input control data to the multiplexer so that it passes a selected one of its input delay line taps to its output. The delay of the programmable delay circuit is the sum of the delays of all delay line elements through which the input pulse passes enroute to the selected tap, along with the time required for the input pulse to travel though the multiplexer itself.

A "linear" programmable delay circuit provides a delay that is a selected multiple of a desired unit delay. If all elements of a delay line had the same unit delay, then the total delay provided by the programmable delay circuit would be a linear function of the number of delay elements the input signal passes through enroute to the selected tap. However even though delay elements may be formed by similar logic gates, "similar" logic gates typically not provide exactly the same delay because, due to integrated circuit process variations, the gates are not exactly similar, even when implemented on the same integrated circuit.

The article entitled "CMOS Programmable Delay Vernier" by Masaharu Goto et al, published in the United States of America in October 1994 in the Hewlett-Packard Journal, describes a system for correcting non-linear characteristics in a programmable delay circuit of the type employing a multiplexer to select a tap of a tapped delay line. This article describes each element of the tapped delay line as being formed by two inverter stages connected in series with a variable capacitor coupling the output of the first inverter stage to ground. The capacitance provided by the capacitor within each stage is selected by data stored in a separate register for each stage. The delay of each element is a function of the delays of the two inverter stages and the selected amount of capacitance. The Goto et al article teaches that to provide for linear characteristics one can adjust the delay provided by each delay element by adjusting the capacitance for that element so that the delay element provides a desired unit delay. One drawback to this system is that a delay line having many delay elements requires many capacitors and registers.

SUMMARY OF THE INVENTION

A programmable delay circuit in accordance with the invention produces an OUTPUT signal following an INPUT signal by one of N delays selected by input delay selection data. Each of the N delays is separately calibratable. The delay circuit includes a tapped delay line, a multiplexer, a delay adjustment stage and a programmable encoder. The delay line includes a set of N delay elements connected in series for successively delaying the INPUT signal to produce a set of N output TAP signals that are progressively delayed versions of the INPUT signal. The TAP signals drive separate inputs of the multiplexer which passes a selected one of the TAP signals to the delay adjustment stage. The delay adjustment stage then delays the selected TAP signal to produce the OUTPUT signal. The programmable encoder converts the input DELAY data into control signals which tell the multiplexer which TAP signal to select and which adjust the delay of the delay adjustment stage. The manner in which the encoder encodes the input DELAY data to produce the control signals is adjustable so that each of the N selectable circuit delays can be separately calibrated.

It is accordingly an object of the invention to provide a programmable delay circuit capable of providing any of a plurality of delays in response to input delay selection data wherein each delay is separately calibratable.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

FIG. 1 is a block diagram of a programmable delay circuit in accordance with the present invention.

DESCRIPTION OF THE PREFERRED EMBODIMENT(S)

Figure 1:
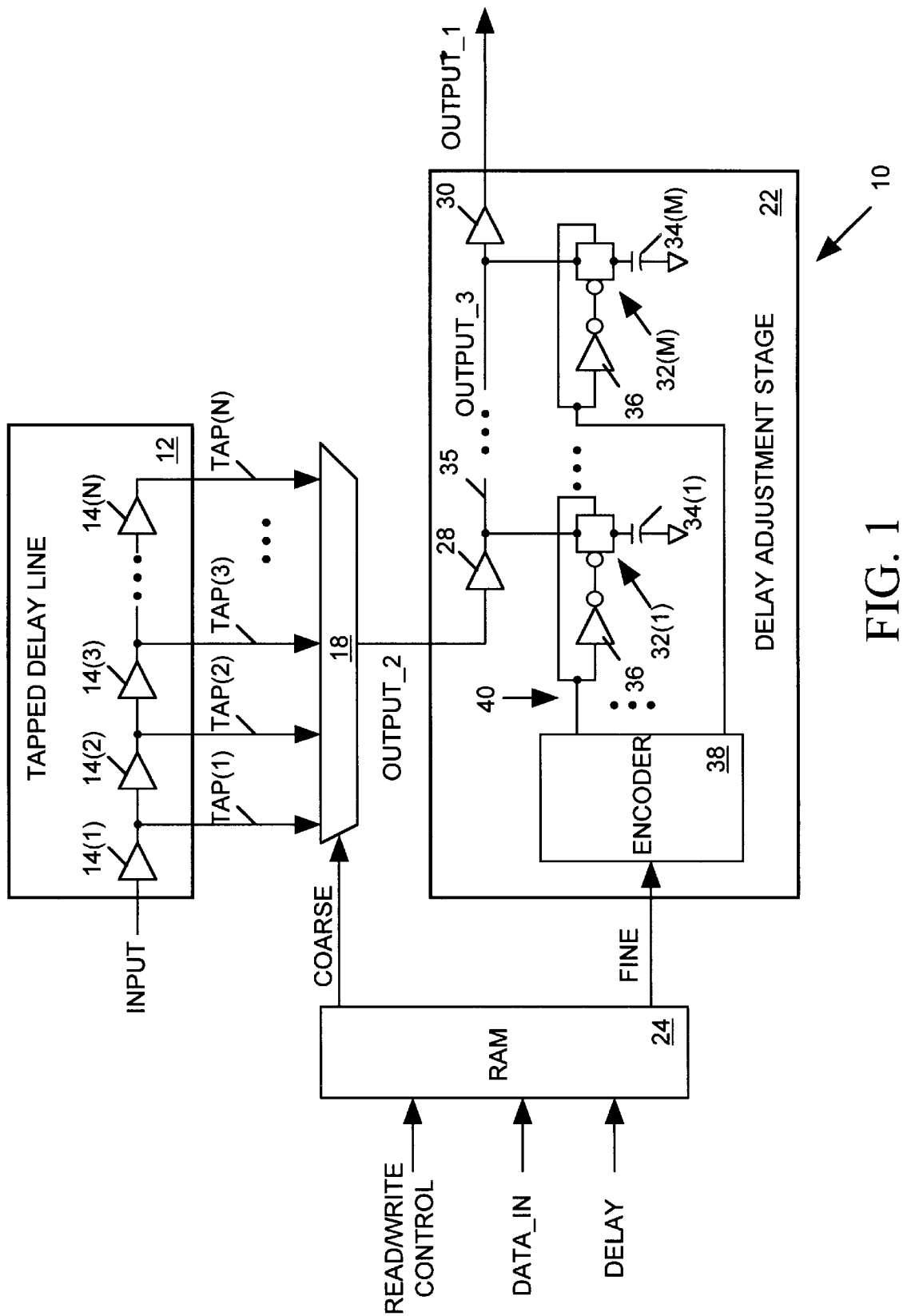

FIG. 1 illustrates a programmable delay circuit 10 for adjustably delaying an INPUT signal pulse to produce an OUTPUT_1 signal pulse wherein the delay between the INPUT and OUTPUT_1 signal pulses is controlled by input delay selection data, DELAY. Circuit 10 provides N selectable delay times and each delay time is independently calibratable. In many applications it is desired that a programmable delay circuit provide N selectable delays that conform to the linear function:

$$DELAY(n) = (n * UNIT\_DELAY) + MINIMUM\_DELAY \quad [1]$$

where UNIT_DELAY and MINIMUM_DELAY are constants and n is any integer from 1 to N. Delay circuit 10 can provide the linear relationship of equation [1] with a high degree of accuracy because it allows a user to accurately and separately adjust each of its N delays.

As illustrated in FIG. 1, delay circuit 10 includes a tapped delay line 12 having N delay elements 14(1)–14(N) connected in series. Each delay element 14 is suitably a logic gate for producing an output signal pulse in delayed response to an INPUT signal. The INPUT signal drives delay element 14(1) and passes through each delay element 14(1)–14(N) in succession. Thus in response to the INPUT signal, each delay element 14(1)–14(N) produces a separate TAP signal output TAP(1)–TAP(N). Each TAP signal drives a separate input of an N-input multiplexer 18 which selects one of the TAP signals to drive its output signal, OUTPUT_

2. A delay adjustment stage 22 delays the OUTPUT_2 signal by an adjustable amount to produce the delay circuit 10 OUTPUT_1 signal. The amount of time by which the delay adjustment stage 22 delays the OUTPUT_2 signal is independently adjustable for each of the N delays delay circuit 10 provides.

The delay selection data, DELAY, addresses a conventional random access memory (RAM) 24. Normally in a read mode, RAM 24 responds to the DELAY data by reading out first output data COARSE for controlling multiplexer 18 and second output data FINE for controlling the delay of delay adjustment stage 22. Thus RAM 24 encodes each possible value of its input DELAY data to produce appropriate values of COARSE and FINE control data, which it stores at the location addressed by the DELAY data value being encoded. An external controller such as a conventional computer may write COARSE and FINE data into RAM 24 in a conventional manner by supplying a COARSE/FINE data pair to data input terminals (DATA_IN) of RAM 24, setting the DELAY data to a desired RAM address, and then pulsing a READ/WRITE control signal input to RAM 24. This places RAM 24 momentarily in a write mode wherein the COARSE/FINE data is written into the current RAM 24 address.

The delay adjustment stage 22 includes a pair of drivers 28 and 30 connected in series. Driver 28 receives the OUTPUT_2 signal from multiplexer 18 and produces an OUTPUT_3 signal at a circuit node 35 in response thereto. Driver 30 receives the OUTPUT_3 signal at node 35 and produces the OUTPUT_1 signal in response thereto. A set of M CMOS pass transistor pairs 32(1)–32(M) selectively couple corresponding capacitors 34(1)–34(M) to the node 35 between drivers 28 and 30. An encoder 38 further decodes the FINE data output of PAM 24 to produce a set of control signals 40. Each control signal 40 acts directly or indirectly via a corresponding inverter 36 to selectively turn on or off a corresponding one of pass transistor pairs 32(1)–32(M) to connect or disconnect the corresponding capacitor 34(1)–34(M) to or from node 35. The delay of the OUTPUT_3 signal pulse as it passes between drivers 28 and 30 is affected by the capacitance connected to node 35—the higher the capacitance connected to node 35, the longer the delay.

The total delay between an INPUT signal pulse arriving at the input of delay element 14(1) and a resulting OUTPUT_1 signal pulse departing driver 30 of adjustment stage 22 includes the delay of each delay line element 14 through which it passes to become the selected TAP(n) signal, the inherent delay of multiplexer 18 in passing the selected TAP(n) signal to delay adjustment stage 22 as the OUTPUT_2 signal, and the delay of delay adjustment stage 22 in producing the OUTPUT_1 signal in response to the OUTPUT_2 signal.

The delay between the INPUT and OUTPUT_2 signals depends on the number n of elements through which the INPUT signal passes to become the selected TAP(n) signal. If the delay elements 14(1)–14(N) each provided a delay equal to UNIT_DELAY of equation [1] above, and if the delay of multiplexer 18 did not vary with the selected tap and were equal to the desired MINIMUM_DELAY, then equation [1] above would properly characterize the delay between INPUT and OUTPUT_2. In such case delay adjustment stage 22 would be unnecessary in order to calibrate the delay circuit 10 so as to provide the desired set of linearly-related delays defined by equation [1]. However in practice it is difficult to produce a tapped delay line 12 in which the delay elements have accurately matched delays. Even when delay elements 14(1)–14(N) are of similar design and are implemented on the same integrated circuit, process variations produce variations in the delays that they provide. Also the inherent delay of multiplexer 18 is difficult to accurately control and can vary depending on which tap it selects.

While delays provided by elements 14(1)–14(N) can vary, they are each designed to remain within a range that does not exceed the desired UNIT_DELAY. This allows the delay adjustment stage 22 to adjust the circuit delay by adding an appropriate compensating delay. The delay correction range that delay calibration stage 22 provides is proportional to the sum of capacitances of capacitors 34. The accuracy of delay adjustment stage 22 provides is related to the resolution (the minimum unit capacitance) by which the total capacitance connected to node 35 can be adjusted. One skilled in the art will appreciate that the size and number M of capacitors 34 are matters of design choice. For example, to maximize capacitance range for a given number M of capacitors, each capacitor 34(m) is suitably provided with a capacitance that is $2^m$ times the desired unit capacitance. Alternatively, for example, where it is preferable to employ capacitors 34 having the same unit capacitance, we choose the number M of capacitors 34 to satisfy the total capacitance requirement. The FINE data in RAM 24 is appropriately sized for the number M of independently controlled pass transistors 32. Note that encoder 38 could be eliminated if the FINE data has M bits since in that case each FINE data bit could directly control a separate pass transistor pair 32(1)–32(M).

Each storage location in RAM 24 corresponds to a separate one of the N selectable delays, DELAY(1)–DELAY(N). The COARSE/FINE data pair stored at each address of RAM 24 can be independently adjusted to calibrate delay circuit 10 to provide an appropriate set of selectable delays so that equation [1] is satisfied. Delay circuit 10 may be calibrated for each value of DELAY(n) using an interactive process. First, at RAM 24 address n, we write COURSE data which causes multiplexer 18 to select TAP(n) thereby giving tapped delay line 12 is largest delay, and we write FINE data which causes all pass transistor pairs 32(1)–32(M) to disconnect their capacitors 34 from node 35, thereby giving delay adjustment stage 22 its smallest delay. The INPUT-to-OUTPUT_1 signal delay is then measured. If the measured delay is larger than the desired delay, a new value of COARSE is written into RAM 24 which will cause multiplexer 18 to select tap TAP(n-1). The resulting INPUT-to-OUTPUT_1 signal delay is again measured. If the measured delay is still too large, the stored value of COARSE is again adjusted to select tap TAP(n-2). This process is repeated until the delay is less than the desired delay. At that point the value of the FINE data stored at RAM 24 address n is then successively altered to progressively increase the amount of capacitance connected to node 35 until the measured INPUT-to-OUTPUT_1 delay is most nearly equal to the desired delay. The process is repeated for each of the N addresses of RAM 24 so that all N values of DELAY(n) are properly calibrated.

As may be seen from the foregoing discussion, RAM 24 acts as an encoder to convert the input DELAY data into delay control signals supplied to multiplexer 18 and to delay adjustment stage 22. RAM 24 acts as a programmable encoder in that the manner in which it encodes its input DELAY data can be adjusted by writing data into RAM 24 for each of the N delays. In particular, the READ/WRITE, DATA_IN and DELAY signal inputs to RAM 24 are in effect programming signals which independently program the manner in which the encoder implemented by RAM 24 encodes each input DELAY value when RAM 24 operates its read mode. The adjustability of the encoding of the input delay selection data allows each of the N selectable delays to be independently calibrated.

Thus has been shown and described a programmable delay circuit 10 for providing a selected one of a set of N signal delays, wherein each delay of the set may be independently calibrated. However it should be noted that when RAM 24 has more than N addressable storage locations, delay circuit 10 can provide more than N selectable delays. Also since the selectable delays are independently adjustable, then where application needs dictate, the selectable delays can be calibrated to conform to other than the linear relation outlined in equation [1] above. Thus while the forgoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. A programmable delay circuit for producing a FIRST OUTPUT signal in delayed response to an INPUT signal, wherein said FIRST OUTPUT signal lags said INPUT signal with a circuit delay referenced by input delay selection data, the delay circuit comprising:

encoding means for receiving and encoding said input delay selection data to produce output COARSE data and FINE data, said COARSE data indicating a first delay and said FINE data indicating a second delay, wherein values of COARSE and FINE data produced by said encoding means in response to each value of input delay selection data are determined by programming data provided as input to said encoding means;

first delay means for receiving said INPUT signal and for producing in response thereto a succession of TAP signals;

multiplexing means for receiving said TAP signals, for receiving said COARSE data from said encoding means and for producing a SECOND OUTPUT signal in response to one of said TAP signals selected in accordance with a value of said COARSE data such that said SECOND OUTPUT signal lags said INPUT signal by said first delay; and second delay means for receiving said FINE data, for receiving said SECOND OUTPUT signal and for producing said FIRST OUTPUT signal in response to said SECOND OUTPUT signal after said second delay of duration controlled by said FINE data.

2. The programmable delay circuit in accordance with claim 1 wherein said encoding means comprises a random access memory (RAM) having a plurality of addressable storage locations therein each storing said COARSE data and FINE data in response to said input programming data, said RAM being addressed by said input delay selection data and reading out addressed COARSE and FINE data values to said multiplexing means and said second delay means, respectively.

3. The programmable delay circuit in accordance with claim 1 wherein said first delay means comprises a plurality of delay elements connected in series, for successively delaying said INPUT signal, each delay element producing one of said TAP signals.

4. The programmable delay circuit in accordance with claim 2 wherein said first delay means comprises a plurality of delay elements, connected in series, for successively delaying said INPUT signal, each delay element producing one of said TAP signals.

5. The programmable delay circuit in accordance with claim 1 wherein said second delay means comprises:
a circuit node;
a first driver for receiving said SECOND OUTPUT signal and producing a THIRD OUTPUT signal at said circuit node in response to said SECOND OUTPUT signal;
a second driver, having an input connected to said circuit node for receiving said THIRD output signal, for producing said FIRST OUTPUT signal in response to said THIRD OUTPUT signal;
a plurality of capacitors; and
means for receiving said FINE data and for connecting selected ones of said capacitors to said circuit node in response to said FINE data.

6. The programmable delay circuit in accordance with claim 2 wherein said second delay means comprises:
a circuit node;
a first driver for receiving said SECOND OUTPUT signal and producing a THIRD OUTPUT signal at said circuit node in response to said SECOND OUTPUT signal;
a second driver, having an input connected to said circuit node for receiving said THIRD output signal, for producing said FIRST OUTPUT signal in response to said THIRD OUTPUT signal;
a plurality of capacitors; and
means for receiving said FINE data and for connecting a selected number of said capacitors to said circuit node in accordance with said FINE data.

7. The programmable delay circuit in accordance with claim 3 wherein said second delay means comprises:
a circuit node;
a first driver for receiving said SECOND OUTPUT signal and producing a THIRD OUTPUT signal at said circuit node in response to said SECOND OUTPUT signal;
a second driver, having an input connected to said circuit node for receiving said THIRD output signal, for producing said FIRST OUTPUT signal in response to said THIRD OUTPUT signal;
a plurality of capacitors; and
means for receiving said FINE data and for connecting a selected number of said capacitors to said circuit node in accordance with said FINE data.

8. The programmable delay circuit in accordance with claim 1 wherein said encoding means responds to said programming data by independently adjusting values of the COARSE and FINE data that said encoding means produces in response to each value of said input delay selection data.

9. The programmable delay circuit in accordance with claim 3 wherein said encoding means responds to said programming data by independently adjusting values of the COARSE and FINE data that said encoding means produces in response to each value of said input delay selection data.

10. The programmable delay circuit in accordance with claim 5 wherein said encoding means responds to said programming data by independently adjusting values of the COARSE and FINE data that said encoding means produces in response to each value of said input delay selection data.

11. The programmable delay circuit in accordance with claim 6 wherein said encoding means responds to said programming data by independently adjusting values of the COARSE and FINE data that said encoding means produces in response to each value of said input delay selection data.

12. The programmable delay circuit in accordance with claim 7 wherein said encoding means responds to said programming data by independently adjusting values of the COARSE and FINE data that said encoding means produces in response to each value of said input delay selection data.

* * * * *